United States Patent
Lee et al.

(10) Patent No.: US 9,461,125 B2
(45) Date of Patent: Oct. 4, 2016

(54) METHOD OF PREPARING MONOATOMIC LAYER BLACK PHOSPHOROUS BY IRRADIATING ULTRASOUND

(71) Applicant: KOREA BASIC SCIENCE INSTITUTE, Daejeon (KR)

(72) Inventors: Hyun-Uk Lee, Cheongju-si (KR); Jou-Hahn Lee, Daejeon (KR); Soon-Chang Lee, Daejeon (KR)

(73) Assignee: Korea Basic Science Institute, Daejeon (KR)

( * ) Notice: Subject to any disclaimer, the term of this patent is extended or adjusted under 35 U.S.C. 154(b) by 0 days.

(21) Appl. No.: 14/879,734

(22) Filed: Oct. 9, 2015

(65) Prior Publication Data

US 2016/0126323 A1   May 5, 2016

(30) Foreign Application Priority Data

Oct. 10, 2014   (KR) .................. 10-2014-0136948

(51) Int. Cl.
   *H01L 29/24*   (2006.01)
   *H01L 29/04*   (2006.01)
   *H01L 21/46*   (2006.01)

(52) U.S. Cl.
   CPC .............. *H01L 29/24* (2013.01); *H01L 21/46* (2013.01); *H01L 29/04* (2013.01)

(58) Field of Classification Search
   CPC ........ H01L 29/24; H01L 29/04; H01L 21/46
   See application file for complete search history.

(56) References Cited

U.S. PATENT DOCUMENTS

| | | | | |
|---|---|---|---|---|
| 2007/0048610 A1* | 3/2007 | Tsang | ...................... | H01M 4/38 429/218.1 |
| 2008/0038626 A1* | 2/2008 | Park | ....................... | C01B 25/02 429/50 |
| 2009/0061169 A1* | 3/2009 | Khaselev | ........ | H01L 31/022425 428/195.1 |
| 2012/0237692 A1* | 9/2012 | Nam | ...................... | B05D 1/185 427/532 |

FOREIGN PATENT DOCUMENTS

| | | |
|---|---|---|
| KR | 10-0788487 | 12/2007 |
| KR | 10-1312160 | 9/2013 |
| KR | 10-2014-0102368 | 8/2014 |

OTHER PUBLICATIONS

Korean Notice of Allowance with allowed claims along with an English translation for Patent Application No. 10-2014-0136948, dated Feb. 13, 2015, 11 pages.

Korean Office action along with an English translation for Patent Application No. 10-2014-0136948, dated Jan. 27, 2015, 12 pages.

* cited by examiner

*Primary Examiner* — Minh-Loan Tran
*Assistant Examiner* — Farid Khan
(74) *Attorney, Agent, or Firm* — Lewis Roca Rothgerber Christie LLP

(57) ABSTRACT

A method of preparing monoatomic layer black phosphorous by irradiating an ultrasound includes: putting black phosphorus into a solvent and irradiating the ultrasound; recovering a solution from a solution to which the ultrasound is irradiated; and collecting black phosphorus remaining after the solution has been recovered, putting the black phosphorus into a solvent, irradiating the ultrasound, and recovering a solution.

9 Claims, 4 Drawing Sheets

METHOD OF PREPARING MONOATOMIC LAYER BLACK PHOSPHOROUS BY IRRADIATING ULTRASOUND

CROSS-REFERENCE TO RELATED APPLICATION

This application claims priority to Korean Patent Application No. 10-2014-0136948 filed on Oct. 10, 2014, and all the benefits accruing therefrom under 35 U.S.C. §119, the contents of which is incorporated by reference in its entirety.

BACKGROUND OF THE INVENTION

1) Field of the Invention

The present invention relates to a method of preparing monoatomic layer black phosphorous having a single crystal structure by irradiating an ultrasound.

2) Background of Related Art

Graphene, which is a representative 2-D layer material, has higher electrical conductivity, electron mobility 100 times faster than that of silicon mainly used for a semiconductor, strength 100 times stronger than that of steel, and excellent thermal conductivity. Accordingly, studies and researches have been performed on the graphene. However, the graphene has a closed band structure in which the direct bandgap of electrons is insufficiently formed between a valance band and a conductive band. Accordingly, studies and researches have been performed toward fields, such as an electrode, heat transfer, and EM suppression, which facilitate applications, in addition to an active area of a semiconductor device due to the inherent limitation of the material.

The studies and researches have deeply performed on a nano-semiconductor device having high mobility using a chalcogenide-based material, such as MoS or WS, which is recently spotlighted and a 2-D layer material having an open band structure. When the chalcogenide-based compound is decomposed to a single layer or less, the chalcogenide-based compound may be used for a direct-bandgap semiconductor. However, since the chalcogenide-based compound has a limitation of serving as a compound of heterogeneous elements, the chalcogenide-based compound may not form a large-area material used to prepare a pure material and produce an electronic device.

To substitute for the chalcogenide-based material, phosphorene has been found out, and the phosphorene has a structure similar to that of carbon-based graphene, includes phosphorous atoms, has higher mobility, and serves as the 2-D material. The phosphorene may be delaminated from a black phosphorous crystal through a mechanical exfoliation (tapping) method in the same manner that a graphene layer is mechanically delaminated from a bulk of graphite. However, there are not developed a method of delaminating the black phosphorous to a monoatomic layer to obtain a single crystal similarly to that of the graphene.

As the related art, there is Korean Patent Registration No. 10-0788487 (issued on Dec. 17, 2007) entitled "Method for preparing black Phosphorus and black Phosphorus-carbon composites, prepared black Phosphorus and black Phosphorus-carbon composites and lithium rechargeable battery including the same, and method for using the rechargeable battery".

SUMMARY OF THE INVENTION

The present invention provides a method of preparing monoatomic layer black phosphorous having a single crystal structure by irradiating an ultrasound.

The objects of the present invention are not limited to the above-mentioned objects, and other objects will be clearly understood from the following description by those skilled in the art.

In order to accomplish the above object, there is provided a method of preparing monoatomic layer black phosphorous by irradiating an ultrasound, which includes putting black phosphorus into a solvent and irradiating an ultrasound, recovering a solution from a solution to which the ultrasound is irradiated, and collecting black phosphorus remaining after the solution has been recovered, putting the black phosphorus into a solvent, irradiating the ultrasound, and recovering a solution.

In this case, a process of irradiating the ultrasound to the remaining black phosphorous, putting the black phosphorous, which remains in the solution, into a solvent, and irradiating the ultrasound is repeatedly performed at one to ten times.

The alcohol may include at least one selected from the group consisting of ethanol, methanol, propanediol, pentanol, octanol, and the organic solvent may include at least one selected from the group consisting of tetrahydrofuran (THF), hexane, tetrachloride, and toluene.

In addition, 0.1 g to 10 g of the black phosphorous is contained in 0.1 L to 50 L of the solvent.

The solvent and the remaining black phosphorous are collected through centrifugation or precipitation.

The ultrasound is irradiated at a frequency of 0.1 kHz to 100 kHz for one minute to 60 minutes.

The ultrasound is irradiated at a temperature of −20° C. to 100° C.

The monoatomic layer black phosphorous has a triangular single crystal.

In addition, according to the present invention, there is provided a method of delaminating a multi-atom layer by irradiating an ultrasound, which includes the steps of putting a material formed at the multi-atom layer into a solvent and irradiating the ultrasound, and recovering a solution by performing solid-liquid separation with respect to the solution to which the ultrasound is irradiated, putting the remaining material formed at the multi-atom layer into the solvent, and irradiating the ultrasound.

The material formed at the multi-atom layer is black phosphorous or graphene.

The step of putting the remaining material formed at the multi-atom layer into the solvent, and irradiating the ultrasound is repeatedly performed at one to ten times.

As described above, in the method of preparing monoatomic layer black phosphorous by irradiating the ultrasound according to the present invention, black phosphorous having the same crystal structure as that of graphene can be delaminated to a monoatomic layer, and can be prepared in the form of a triangular single crystal instead of an amorphous form.

In addition, the black phosphorous may be prepared in the triangular single crystal, so that the black phosphorous may be smoothly prepared in a nanostructure. Further, the black phosphorus has the mobility higher than that of the graphene and an excellent on/off ratio, so that the black phosphorus can be usefully used as an electronic material in a semiconductor and the like.

DETAILED DESCRIPTION OF THE INVENTION

Hereinafter, an example embodiment of the present invention will be described in detail with reference to accompanying drawings.

The advantages, the features, and schemes of achieving the advantages and features of the present invention will be apparently comprehended by those skilled in the art based on the embodiments, which are detailed later in detail, together with accompanying drawings.

However, the present invention is not limited to the following embodiments but includes various applications and modifications. The embodiments will make the disclosure of the present invention complete, and allow those skilled in the art to completely comprehend the scope of the present invention. The present invention is only defined within the scope of accompanying claims.

In addition, the details of the generally-known technology that makes the subject matter of the present invention unclear will be omitted in the following description.

The present invention provides a method of preparing monoatomic layer black phosphorous by irradiating an ultrasound, which includes the steps of putting black phosphorus into a solvent and irradiating the ultrasound, recovering a solution from a solution to which the ultrasound is irradiated, and collecting black phosphorus remaining after the solution has been recovered, putting the black phosphorus into a solvent, irradiating the ultrasound, and recovering a solution.

In the method of preparing monoatomic layer black phosphorous by irradiating the ultrasound according to the present invention, the black phosphorous having the same crystal structure as that of graphene may be delaminated to a monoatomic layer by irradiating the ultrasound, and may be prepared in the form of a triangular single crystal structure instead of an amorphous form. In addition, the black phosphorous may be prepared in the triangular single crystal, so that the black phosphorous may be smoothly prepared in a nanostructure. Further, the black phosphorus has the mobility higher than that of the graphene and an excellent on/off ratio, so that the black phosphorus may be usefully used as an electronic material in a semiconductor and the like.

Figure 1:
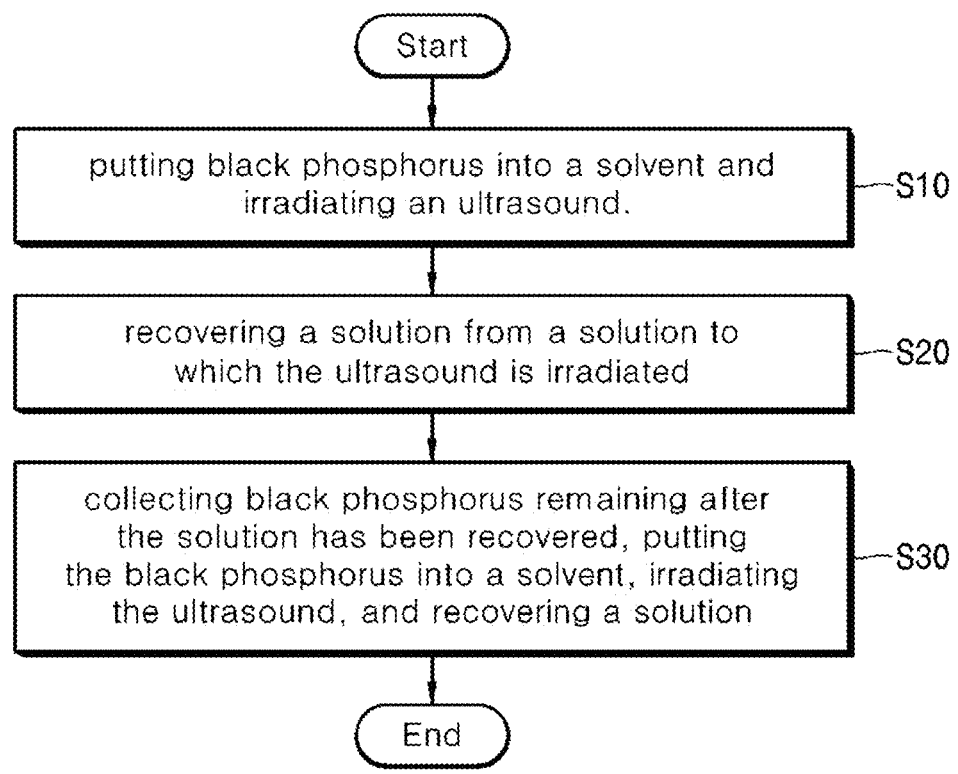
FIG. 1 is a flowchart showing a method of preparing monoatomic layer black phosphorous by irradiating an ultrasound according to the present invention.

FIG. 1 is a flowchart showing the method of preparing monoatomic layer black phosphorous using ultrasound irradiation according to the present invention. Hereinafter, the present invention will be described in detail with reference to FIG. 1.

The method of preparing monoatomic layer black phosphorous using ultrasound irradiation according to the present invention includes a step of putting black phosphorus into a solvent and irradiating the ultrasound (step S10).

In the method of preparing monoatomic layer black phosphorous using ultrasound irradiation according to the present invention, the black phosphorus is generally known as the most stable material among the allotropes of phosphorous (white, red, and black phosphorous), and the crystal structure of the black phosphorus has a layer in which one atom is bonded with three atoms. The black phosphorus may be ground to 0.001-100 in order to facilitate dispersion when the ultrasound is irradiated thereto.

In the method of preparing monoatomic layer black phosphorous using ultrasound irradiation according to the present invention, the solvent may include at least one selected from the group consisting of distilled water, an organic solvent, an acidic solution, and a basic solution. In this case, when the distilled water is used, the black phosphorus may be easily dispersed. When alcohol is used, the crystallinity may be improved. When the organic solvent is used, the electrical conductivity of the delaminated black phosphorus may be improved.

The organic solvent may include at least one selected from the group consisting of ethanol, methanol, propanediol, pentanol and octanol. The organic solvent may include at least one selected from the group consisting of tetrahydrofuran (THF), hexane, tetrachloride, and toluene.

The acidic solution may be used in the acidic solution may be diluted with distilled water. The acidic solution may include at least one selected from the group consisting of hydrochloric acid, sulfuric acid, nitric acid and acetic acid. The basic solution may include at least one selected from the group consisting of sodium hydroxide, potassium hydroxide, calcium hydroxide, magnesium hydroxide and ammonia.

In addition, preferably, 0.1 g to 10 g of the black phosphorous is contained in 0.1 mL to 50 mL of a solvent. If less than 0.1 g of the black phosphorous is contained, an amount and the size of the black phosphorous, which is delaminated, are reduced, so that the black phosphorous may be aged in the solution. If more than 10 g of the black phosphorous is contained, the black phosphorous may not be uniformly delaminated.

If the ultrasound is irradiated to the solution having the black phosphorous dissolved therein, the black phosphorous may be uniformly dispersed into the solvent, and atoms may be rearranged due to the ultrasound energy, so that the black phosphorous having a single crystal may be obtained.

The ultrasound irradiation is preferably performed for one minute to 60 minutes. at the frequency of 0.1 kHz to 100 kHz. When the ultrasound is irradiated at less than 0.1 kHz, the black phosphorous may not be delaminated to the monoatomic layer, but may be delaminated to the amorphous structure. When the ultrasound is irradiated at more than 100 kHz, the black phosphorous receives the excessive energy so that the black phosphorous may be delaminated to thin plates to be disappeared in the solution. The reasons for limiting the time have been described above.

In addition, the ultrasound irradiation is preferably performed at the temperature of $-20°$ C. to $100°$ C. When the ultrasound irradiation is performed at the temperature of less than $-20°$ C., the delamination may be slightly performed. When the ultrasound irradiation is performed at the temperature of more than $100°$ C., the delaminated black phosphorous may be disappeared.

Next, the method of preparing monoatomic layer black phosphorous by irradiating the ultrasound includes a step of recovering a solution from a solution to which the ultrasound is irradiated (step S20).

In the method of preparing monoatomic layer black phosphorous by irradiating the ultrasound according to the present invention, since the monoatomic layer black phosphorous is prepared and dispersed in the solution (the mixture of the black phosphorous and a solvent) to which the ultrasound is irradiated, a transparent solution may be obtained. Accordingly, the black phosphorous, which is not dissolved in the solvent, may remain at a lower portion of the solution, and only the solution is recovered.

The method of preparing monoatomic layer black phosphorous by irradiating the ultrasound according to the present invention include a step of collecting the black phosphorous remaining after the solution has been recovered, putting the black phosphorous into the solvent, irradiating the ultrasound, and recovering the solution (step S30).

Multi-atomic layer black phosphorous, which is a starting material, is not changed into the monoatomic layer black phosphorous, but remains in the solution after the ultrasound has been irradiated. The remaining black phosphorous may be collected through centrifugation or precipitation. When the precipitation is performed, the remaining black phosphorous is left for about two hours, so that the multi-atomic layer black phosphorous may be precipitated and collected. In addition, to rapidly and easily collect the remaining black phosphorous, it is preferred that the centrifugation is used.

In the method of preparing monoatomic layer black phosphorous by irradiating the ultrasound according to the present invention, a process of irradiating the ultrasound to the remaining black phosphorous, putting the black phosphorous, which remains in the solution, into the solvent and irradiating the ultrasound thereto is repeatedly performed at one to ten times, so that the multi-atomic layer black phosphorous may be continuously delaminated. Accordingly, the monoatomic layer black phosphorous may be obtained from the solution. Further, the monoatomic layer black phosphorous may be prepared from the multi-atomic layer black phosphorous through the ultrasound irradiation, so that the black phosphorous having the triangular single crystal may be prepared.

In this case, a process of grinding the remaining black phosphorous may be additionally performed, so that the monoatomic layer black phosphorous may be increasingly prepared in the ultrasound irradiation.

In addition, the present invention provides a method of delaminating a multi-atomic layer black phosphorous by irradiating the ultrasound, which includes the steps of putting a multi-atomic layer material into a solvent and irradiating the ultrasound to the result, and performing solid liquid separation with respect to the solution, to which the ultrasound is irradiated, to recover the solution, to put the remaining multi-atomic layer material into the solvent, and to irradiate the ultrasound to the result.

The multi-atomic material may be black phosphorous or grapheme, and may be delaminated to the monoatomic layer material by performing the step of irradiating the ultrasound to the remaining multi-atomic material, putting the remaining multi-atomic material into the solvent, and repeatedly irradiating the ultrasound at one to ten times.

Embodiment 1

Preparation 1 of Monoatomic Layer Black Phosphorous

After multi-atomic layer black phosphorous had been ground with a mortar for one min. to 30 min., 0.1 g to 10 g of the ground black phosphorous was put into a 50-ml conical tube with respect to 0.1 mL to 50 mL of ethanol. The solution of black phosphorous and ethanol were put on an ultrasound generating device vibrating at the frequency of 0.1 kHz to 100 kHz for one min. to 60 min to transfer the ultrasound energy to the solution. In this case, the temperature of the solution was in the range of −20° C. to 100° C. The dispersed solution after the ultrasound irradiation is in a transparent state, and filtered through centrifugation. The multi-atomic layer black phosphorous remaining in the solution without being dispersed in the solution has precipitated. Then ethanol was added to the precipitated black phosphorus portion to generate a second solution, the ultrasound was irradiated to the second solution containing the remaining multi-atomic layer black phosphorous to filter the dispersed black phosphorous through solid liquid separation. Ethanol was added again to the filtered multi-atomic layer black phosphorous, which was precipitated without being dispersed, and the ultrasound irradiation was performed, so that the multi-atomic layer black phosphorous could be dispersed again. Since the monoatomic layer black phosphorous was contained in the dispersion solution, the monoatomic layer black phosphorous was obtained by recovering the solution.

Embodiment 2

Preparation 2 of Monoatomic Layer Black Phosphorous

The multi-atomic layer black phosphorous according to the first embodiment, which precipitated, was re-collected and adding the ethanol to the multi-atomic layer black phosphorous, and the ultrasound was irradiated to the result, so that the transparent solution was recovered through the solid liquid separation. The multi-atomic layer black phosphorous, which was and precipitated, was collected, and adding the ethanol to the collected. the ultrasound was irradiated to re-disperse the multi-atomic layer black phosphorous, so that the monoatomic layer black phosphorous was prepared.

Embodiment 3

Preparation 3 of Monoatomic Layer Black Phosphorous

The multi-atomic layer black phosphorous according to the second embodiment, which was precipitated, was ground in a mortar and added the ethanol to the second embodiment, and the ultrasound was irradiated to the result, so that the transparent solution was recovered through the solid liquid separation. The multi-atomic layer black phosphorous, which was precipitated, added the ethanol to the multi-atomic layer black phosphorous and the ultrasound was irradiated. The above process was repeatedly performed at one to ten times so that the monoatomic layer black phosphorous was prepared.

Experimental Example

Figure 2:
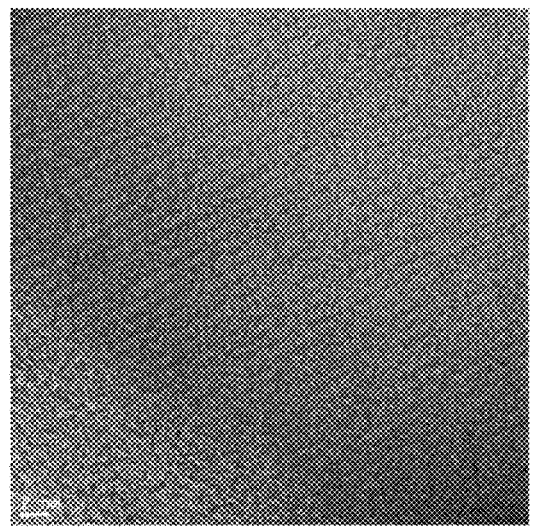
FIG. 2 is a TEM photograph showing the monoatomic layer black phosphorous prepared through the method according to the present invention.
Figure 3:
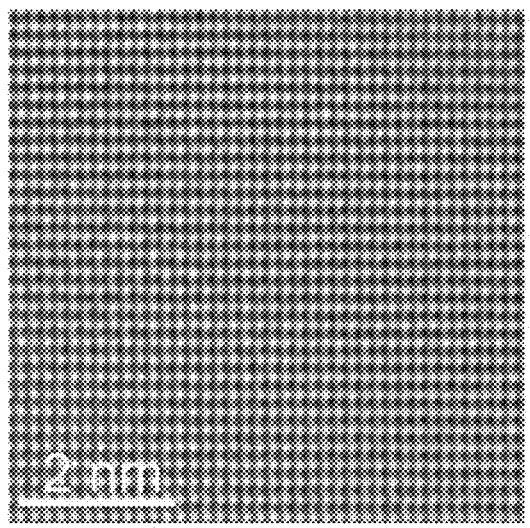
FIG. 3 is a high-magnification TEM photograph showing the monoatomic layer black phosphorous prepared through the method according to the present invention.
Figure 4:
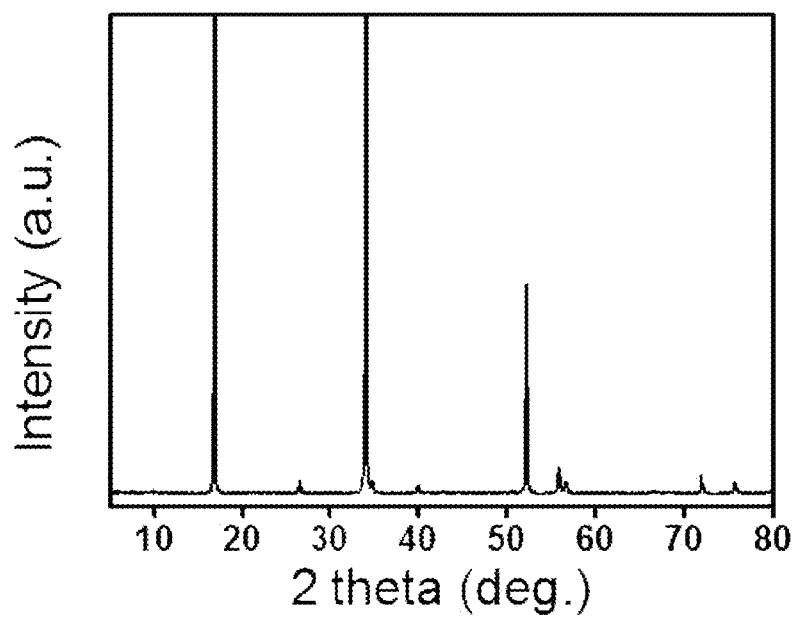
FIG. 4 is an X-ray diffraction analysis result showing the monoatomic layer prepared through the method according to the present invention.

Analysis of Fine Structure and Crystal Structure of Monoatomic Layer Black Phosphorous In order to recognize the fine structure and the crystal structure of the black phosphorous prepared through the method of preparing monoatomic layer black phosphorous by irradiating the ultrasound according to the present invention, transmission electron microscope (TEM) analysis and the X-ray diffraction analysis were performed, and the analysis results are shown in FIGS. 2, 3, and 4.

It may be recognized from FIG. 2 that the monoatomic layer black phosphorous is formed. In addition, the formation of the monoatomic layer black phosphorous may be recognized through a high-magnification TEM photograph. Accordingly, it may be recognized that the multi-atomic layer black phosphorous may be formed to the monoatomic layer black phosphorous through the method of preparing monoatomic layer black phosphorous by irradiating the ultrasound according to the present invention.

Further, as shown in FIG. 4 and table 1, the black phosphorous has a single crystal structure including phosphorous in which $2\theta=18°$, $34°$, or $52°$.

TABLE 1

Calculation of Lattice Constant Based on Peak Location and Mili-Index [Orthorhombic]

| 2-theta | d(A) | h | k | l | a-Axis | b-Axis | c-Axis |
|---------|------|---|---|---|--------|--------|--------|
| 16.897 | 5.243 | 0 | 2 | 0 | — | 10.4859 | — |
| 26.496 | 3.3612 | 0 | 2 | 1 | 3.317 | 10.4859 | 4.3796 |
| 34.174 | 2.6216 | 0 | 4 | 0 | — | 10.4864 | — |
| 34.967 | 2.5639 | 1 | 1 | 1 | 3.317 | 10.4859 | 4.3796 |
| 40.045 | 2.2497 | 0 | 4 | 1 | 3.3157 | 10.4859 | 4.3827 |
| Average lattice constant | | | | | 3.3165 | 10.486 | 4.3806 |

What is claimed is:

1. A method of preparing monoatomic layer black phosphorous, the method comprising:
   putting black phosphorus into a solvent for generating a solution;
   irradiating the solution with ultrasound energy;
   filtering out a solution portion from the solution to which the ultrasound energy has been applied, the solution portion being a clear solution where the monoatomic layer black phosphorous is dissolved, leaving a remaining black phosphorus portion; and
   adding the solvent to the remaining black phosphorus portion for generating a second solution, irradiating the second solution with ultrasound energy, and filtering out a second solution portion from the second solution.

2. The method of claim 1, wherein the process of irradiating the ultrasound energy to the second solution comprises, adding the solvent to the remaining black phosphorous portion and irradiating the ultrasound energy repeatedly between one to ten times.

3. The method of claim 1, wherein the solvent includes at least one selected from the group consisting of distilled water, an organic solvent, an acidic solution, and a basic solution.

4. The method of claim 3, wherein the organic solvent includes at least one selected from the group consisting of ethanol, methanol, propanediol, pentanol, octanol, tetrahydrofuran (THF), hexane, tetrachloride, and toluene.

5. The method of claim 1, wherein 0.1 g to 10 g of the black phosphorous is contained in 0.1 mL to 50 mL of the solvent.

6. The method of claim 1, wherein the solvent and the remaining black phosphorous are collected through centrifugation or precipitation.

7. The method of claim 1, wherein the ultrasound is irradiated at a frequency of 0.1 kHz to 100 kHz for one minute to 60 minutes.

8. The method of claim 1, wherein the ultrasound is irradiated at a temperature of $-20°$ C. to $100°$ C.

9. The method of claim 1, wherein the monoatomic layer black phosphorous has a triangular single crystal.

* * * * *